(12) United States Patent
Boutillon et al.

(10) Patent No.: US 9,438,305 B2
(45) Date of Patent: Sep. 6, 2016

(54) METHOD FOR TRANSMITTING NON BINARY ERROR CORRECTING CODE WORDS WITH CCSK MODULATION, AND CORRESPONDING SIGNAL AND DEVICE

(71) Applicants: UNIVERSITE DE BRETAGNE SUD, Lorient (FR); CENTRE NATIONAL DE LA RECHERCHE SCIENTIFIQUE-CNRS, Paris (FR)

(72) Inventors: Emmanuel Boutillon, Lorient (FR); Laura Conde-Canencia, Lorient (FR); Oussama Abassi, Lorient (FR)

(73) Assignees: Universite de Bretagne SUD, Lorient (FR); Centre National de la Recherche Scientifique—CNRS, Paris (FR)

( * ) Notice: Subject to any disclaimer, the term of this patent is extended or adjusted under 35 U.S.C. 154(b) by 0 days.

(21) Appl. No.: 14/378,270
(22) PCT Filed: Feb. 13, 2013
(86) PCT No.: PCT/EP2013/052842
§ 371 (c)(1),
(2) Date: Aug. 12, 2014
(87) PCT Pub. No.: WO2013/120882
PCT Pub. Date: Aug. 22, 2013

(65) Prior Publication Data
US 2015/0003499 A1 Jan. 1, 2015

(30) Foreign Application Priority Data
Feb. 13, 2012 (FR) ..................... 12 51334

(51) Int. Cl.
*H04B 1/707* (2011.01)
*H03M 13/11* (2006.01)
*H04B 1/69* (2011.01)
(Continued)

(52) U.S. Cl.
CPC .............. *H04B 1/707* (2013.01); *H03M 13/11* (2013.01); *H03M 13/1102* (2013.01); *H03M 13/1171* (2013.01); *H03M 13/156* (2013.01);
(Continued)

(58) Field of Classification Search
USPC ................................ 375/260, 267, 262, 299
See application file for complete search history.

(56) References Cited

U.S. PATENT DOCUMENTS

2010/0266072 A1* 10/2010 Lee et al. ...................... 375/341
2011/0051830 A1* 3/2011 Tsao et al. ..................... 375/261

OTHER PUBLICATIONS

Chi-Han Kao et al. (Am improved Link-16/JTIDS Receiver in Pulsed-Noise Interference), IEEE, Military Communication Conference, 2011, pp. 341-346.*

(Continued)

*Primary Examiner* — Kabir A Timory
(74) *Attorney, Agent, or Firm* — Patterson Thuente Pedersen, P.A.

(57) ABSTRACT

The invention concerns a method for transmitting symbols of non binary error correcting code words via a transmission channel. The method comprises a first modulation associating each code word symbol of p bits with a sequence of at least 2p chips from 2p possible sequences, a second modulation to modulate the phase or amplitude of a carrier signal with the sequences associated with the code words, and a step of transmitting the modulated carrier signal via said transmission channel. According to the invention, the first modulation is a spread spectrum modulation of the cyclic code shift keying type using a basic pseudo-random sequence of at least 2p chips, the possible 2p sequences being obtained by a circular shift of the basic pseudo-random sequence and a cyclic prefix is inserted into each symbol to be transmitted.

4 Claims, 4 Drawing Sheets

(51) Int. Cl.
    *H04L 27/20*   (2006.01)
    *H04J 13/00*   (2011.01)
    *H03M 13/15*   (2006.01)
(52) U.S. Cl.
    CPC ............ *H04B 1/69* (2013.01); *H04J 13/0074* (2013.01); *H04L 27/2003* (2013.01)

(56) References Cited

OTHER PUBLICATIONS

Yu-Zhen Huang et al., "Combine Non-Binary LDPC codes with M-ary orthogonal spread spectrum modulation", 2010 International Conference on Wireless Communications and Signal Processing (WCSP), 2020, pp. 1-4.
Adrian Voicila et al., "Low-Complexity Decoding for Non-Binary LDPC Codes in High Order Fields", IEEE Transactions on Communications, vol. 58, No. 5, May 2010, pp. 1365-1375.
Chi-Han Kao et al., "Performance analysis and simulations of 32-ary cyclic code-shifting keying" International Journal of Communication Systems, 2011: 24:258-268, published online Aug. 28, 2010.
George M. Dillard et al., "Cyclic Code Shift Keying: A Low Probability of Intercept Communication Technique", IEEE Transactions on Aerospace and Electronics Systems, vol. 39, No. 3, Jul. 2003, pp. 786-798.
Yin Hoe Ng et al., "Single Carrier Cyclic Prefix-Assisted PLC Systems with Frequency-Domain Equalization for High-Data-Rate Transmission", IEEE Transactions on Power Delivery, vol. 25, No. 3, Jul. 2010, pp. 1450-1457.
Adrian Voicila et al., "Algorithmes simplifiés pour le décodage de codes LDPC non binaires" (Simplified algorithms for decoding non-binary LDPC codes), GRETSI, Louvain-la-Neuve, Belgium, Sep. 2005, 4 pages.
FR Search Report for FR 1251334, dated Aug. 6, 2012, 2 pages.
PCT International Search Report and Written Opinion for PCT/EP2013/052842, dated Mar. 14, 2013, 9 pages.

\* cited by examiner

METHOD FOR TRANSMITTING NON BINARY ERROR CORRECTING CODE WORDS WITH CCSK MODULATION, AND CORRESPONDING SIGNAL AND DEVICE

PRIORITY CLAIM

The present application is a National Phase entry of PCT Application No. PCT/EP2013/052842, filed Feb. 13, 2013, which claims priority from FR Patent Application No. 1251334, filed Feb. 13, 2012, said applications being hereby incorporated by reference herein in their entirety.

BACKGROUND OF THE INVENTION

The present invention relates to a method for transmitting symbols of non-binary error-correcting code words via a communication channel. These codes are defined over non-binary sets. The invention has applications for example in the transmission of non-binary LDPC (Low Density Parity Check) codes or Reed-Solomon codes. The invention also relates to the corresponding transmitted signal and the receiving of such a signal.

The invention will be more particularly described in the context of non-binary LDPC codes. LDPC codes are known error-correcting codes for approaching the theoretical Shannon limit. Because of their performance in terms of noise immunity, LDPC codes and particularly non-binary LDPC codes have applications in many systems, for example wireless communication systems, optical fiber, cable, digital data storage systems, etc.

Non-binary LDPC codes, also known as NB-LDPC codes, are constructed in a non-binary Galois field of order q, conventionally denoted GF(q). The order q is generally a power of 2, for example $q=2^p$. An LDPC code in GF(q) is defined by a sparse parity check matrix H of size A×B whose elements belong to GF(q), where A is the number of parity constraints and B is the number of elements of GF(q) in the code word. For a Galois field GF(4) composed of 4 elements $\{0, \alpha^0, \alpha^1, \alpha^2\}$, the parity matrix for A=3 and B=6 is for example as follows:

$$H = \begin{pmatrix} 0 & \alpha^0 & \alpha^0 & 0 & \alpha^2 & 0 \\ \alpha^1 & 0 & 0 & \alpha^0 & 0 & \alpha^2 \\ \alpha^0 & 0 & \alpha^2 & 0 & 0 & \alpha^1 \end{pmatrix}$$

This matrix can also be represented by a bipartite graph (Tanner graph) with A parity nodes and B variable nodes receiving the symbols of the code word. Each column of the parity matrix is associated with a variable node and each row of the matrix is associated with a parity node.

In order to transmit them on a communication channel that is usually noisy, it is known to modulate non-binary LDPC codes with an M-ary orthogonal spread-spectrum modulation as described in the document entitled "Combine Non-Binary LDPC codes with M-ary orthogonal spread spectrum modulation", Yu-zhen Huang, Yun-peng Cheng, Yu-ming Zhang, Guo-hai Yu, Jin Chen, 2010 International Conference on Wireless Communications and Signal Processing (WCSP), 2010. The use of a spread spectrum modulation provides better noise immunity.

In particular, this document discloses modulating the symbols of NB-LDPC code words with an orthogonal spread spectrum modulation using $2^M$ Walsh-Hadamard sequences that are orthogonal to each other, with $2^M$ equal to the order $q(=2^p)$ of the Galois field GF(q) of the non-binary LDPC codes, and M equal to the number p of bits of each symbol of the Galois field GF(q). The size $2^M$ of the constellation of the orthogonal modulation is taken as equal to the number $q=2^p$ of symbols of the field of NB-LDPC codes so that there is no loss of information in the demodulation. In that document, the demodulation is relatively complex to implement, as it requires cross-correlation calculations between each of the $2^p$ Walsh-Hadamard sequences and the noisy signal, which has a cost in terms of implementation. In that document, the demodulation is performed by means of $2^p$ matched filters each associated with a predetermined Walsh-Hadamard sequence. One aim of the invention is to overcome the above disadvantage.

SUMMARY OF THE INVENTION

In the invention, we propose using cyclic code-shift keying (or CCSK), instead of an M-ary orthogonal modulation, to spread the spectrum of the transmitted signal.

More particularly, the invention relates to a method for transmitting symbols of non-binary error-correcting code words via a transmission channel, each code word symbol comprising p bits, said method comprising a first modulation step associating each p-bit code word symbol with a sequence of at least $2^p$ chips from $2^p$ possible sequences, a second modulation step to modulate the phase or amplitude of at least one carrier signal with the sequences associated with the code words, and a step of transmitting the modulated carrier signal via said transmission channel, noteworthy in that the first modulation step is a spread spectrum modulation of the cyclic code-shift keying type using a basic pseudo-random sequence of at least $2^p$ chips, the $2^p$ possible sequences being obtained by a circular shift of the basic pseudo-random sequence, and in that the method further comprises, after said second modulation step, a step of inserting a cyclic prefix into each symbol to be transmitted.

With this method, the demodulation in reception can be achieved by simple operations involving fast Fourier transform (FFT) and inverse fast Fourier transform (IFFT). Moreover, this method only requires one pseudo-random generator to generate the $2^p$ sequences.

The basic pseudo-random sequence is generated, at least partially, by a linear feedback shift register that implements a primitive polynomial of order p.

The code words processed are, for example, non-binary LDPC code words or non-binary Reed Solomon code words.

The invention also relates to a device for transmitting symbols of non-binary error-correcting code words via a transmission channel, each code word symbol comprising p bits, said device comprising a first modulator associating each p-bit code word symbol with a sequence of at least $2^p$ chips from $2^p$ possible sequences, a second modulator to modulate the phase or amplitude of a carrier signal with the sequences associated with the code words, and a transmitter for transmitting the modulated carrier signal via said transmission channel, noteworthy in that the first modulator is a spread spectrum modulator of the cyclic code-shift keying type using a basic pseudo-random sequence of at least $2^p$ chips, the $2^p$ possible sequences being obtained by a circular shift of the basic pseudo-random sequence, and in that it further comprises a circuit able to insert a cyclic prefix into each symbol to be transmitted.

The invention also relates to a non-binary error-correcting code signal intended to be transmitted by the method defined above.

The invention also relates to a method for receiving a non-binary error-correcting code signal transmitted on a single carrier signal by the method defined above, characterized in that it comprises a step of receiving the signal, a step of deleting the cyclic prefix from each symbol, a step of fast Fourier transform of the received signal in order to generate samples in the frequency domain, and a step of frequency equalization and calculation of log-likelihood ratio values for said samples.

Indeed, the use of cyclic code-shift keying and insertion of a cyclic prefix into each symbol to be transmitted is particularly suited for wireless communication systems with a single carrier signal, as the frequency equalization and the calculation of log-likelihood ratio values can then be done by the same FFT and IFFT operations.

Lastly, the invention also relates to a device for receiving a non-binary error-correcting code signal transmitted on a single carrier signal by the transmitting device as defined above, characterized in that it comprises a receiver for the transmitted signal, a circuit able to delete the cyclic prefix from each symbol, a circuit for fast Fourier transform of the received signal in order to generate samples in the frequency domain, and a circuit for frequency equalization and calculation of log-likelihood ratio values for said samples.

The invention will be better understood, and other objects, details, features, and advantages will become more apparent, from the following detailed description, with reference to the accompanying drawings which represent:

DETAILED DESCRIPTION OF THE DRAWINGS

The invention proposes modulating the symbols of the NB-LDPC code words delivered by an NB-LDPC encoder with cyclic code-shift keying modulation, commonly referred to as CCSK modulation, using a pseudo-random sequence comprising at least $2^p$ chips. The term "chip" refers to binary information in the code of a spread spectrum modulation.

Figure 1:
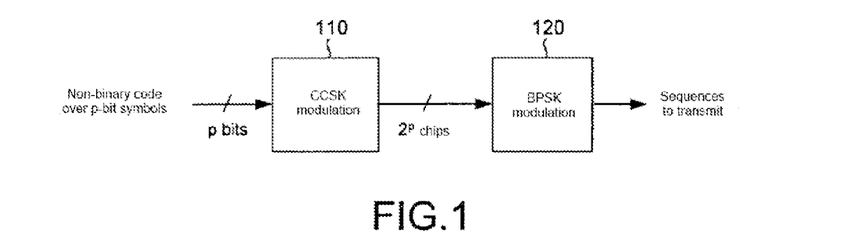
FIG. 1, a block diagram of signal processing according to the invention, comprising a step of CCSK modulation using a basic pseudo-random sequence.

FIG. 1 illustrates the steps of the method according to the invention. In a step denoted 110, the NB-LDPC codes are modulated with a CCSK modulation whose function is to associate each p-bit NB-LDPC code word symbol with a pseudo-random sequence comprising $2^p$ chips. Then, in a step denoted 120, the sequences from step 110 are modulated by a digital modulation whose function is to modulate at least one carrier signal with the generated sequences from step 110. In the example in FIG. 1, the modulation in step 120 is a BPSK modulation (Binary Phase-Shift Keying). In this example, the sequences generated in step 110 modulate the phase of the carrier signal. Modulations, other than BPSK modulation, which modulate the phase or amplitude of the carrier signal are of course possible for step 120.

During step 110, each p-bit symbol is associated with a sequence of at least $2^p$ chips. More specifically, each p-bit symbol is converted into a specific sequence obtained by a circular shift of a basic pseudo-random sequence denoted $PN_0$. Thus, the computations to be performed in reception to determine the transmitted sequence are autocorrelation computations. The autocorrelation computations may be performed using FFT and IFFT operations, which contributes to simplifying the signal processing in reception.

An example of CCSK modulation is described below for 6-bit symbols within the Galois field $GF(64=2^6)$. As the symbols have 6 bits, the pseudo-random sequence must contain at least $64=2^6$ chips so that there is no loss of information. The basic pseudo-random sequence $PN_0$ is chosen so as to provide good performance in terms of autocorrelation. There are several known methods from the literature for achieving this. In the present case, a sequence of 63 chips is generated by a linear feedback shift register, also referred to as an LFSR, to which is added an additional chip to obtain a pseudo-random sequence of 64 chips. This additional bit is added at any location in the sequence. Other methods for generating pseudorandom sequences are possible.

The basic pseudo-random sequence $PN_0$ is, for example, the following 64-bit sequence:

1000001000011000101001111010001110010010110111 0110011010101111111

This sequence is generated by an LFSR implementing the irreducible polynomial $P(x)=1+x+x^6$ and one additional bit.

Figure 2:
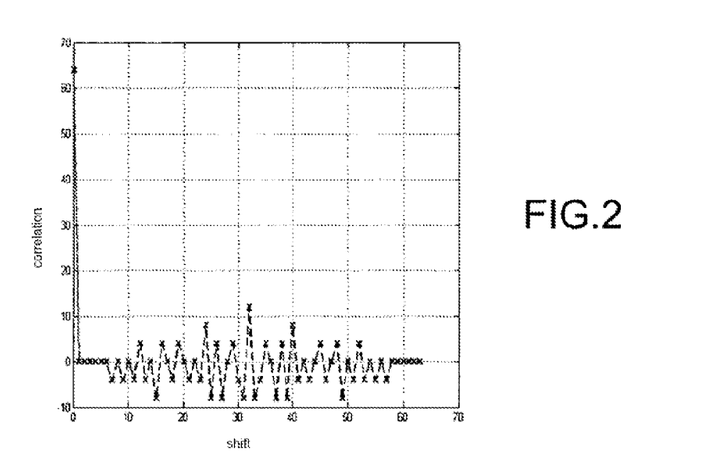
FIG. 2, a graph illustrating the correlation of a basic pseudo-random sequence with a shifted version of this sequence.

The autocorrelation properties of this sequence $PN_0$ are illustrated by the curve in FIG. 2, obtained with a BPSK modulation such as $BPSK(x)=1-2x$ with $x\in\{0,1\}$. As can be seen from this Figure, the autocorrelation of this basic pseudo-random sequence, after BPSK modulation, has a single main peak when the shift is zero and nonzero secondary peaks. We can therefore infer that the CCSK modulation is not orthogonal. In addition, this sequence provides good performance in autocorrelation, as the distance between the main peak and the secondary peaks (shifts of 24, 32 and 40 chips) is relatively large.

From this sequence $PN_0$, 63 other sequences are generated by a circular shift of the sequence $PN_0$, each sequence being associated with an element of the Galois field GF(64). The sequence $PN_0$ is associated with the zero element of the Galois field GF(64). The other elements $\alpha^k$ of GF(64), where $k\in[0,62]$, are obtained by a circular shift of sequence $PN_0$ by k+1 positions to the right.

The summary table below shows the sequences of 64 chips associated with each element of the Galois field GF(64):

| Symbols of GF(64 = 2) | Binary representation of elements | CCSK sequences of 64 chips |
|---|---|---|
| 0 | 000000 | 1000001000011000101001111010001110010010110111011001101010111111 |
| $\alpha^0$ | 000001 | 1100000100001100010100111101000111001001011011101100110101011111 |
| $\alpha^1$ | 000010 | 1110000010000110001010011110100011100100101101110110011010101111 |
| $\alpha^2$ | 000100 | 1111000001000011000101001111010001110010010110111011001101010111 |
| $\alpha^3$ | 001000 | 1111100000100001100010100111101000111001001011011101100110101011 |
| $\alpha^4$ | 010000 | 1111110000010000110001010011110100011100100101101110110011010101 |
| $\alpha^5$ | 100000 | 1111111000001000011000101001111010001110010010110111011001101010 |
| $\alpha^6$ | 000011 | 0111111100000100001100010100111101000111001001011011101101101010 |
| $\alpha^7$ | 000110 | 1011111110000010000110001010011110100011100100101101110110011010 |
| $\alpha^8$ | 001100 | 0101111111000001000011000101001111010001110010010110111011001101 |
| $\alpha^9$ | 011000 | 1010111111100000100001100010100111101000111001001011011101100110 |
| $\alpha^{10}$ | 110000 | 0101011111110000010000110001010011110100011100100101101110110011 |
| $\alpha^{11}$ | 100011 | 1010101111111000000100001100010100111101000111001001011011011001 |
| $\alpha^{12}$ | 000101 | 1101010111111100000010000110001010011110100011100100101101111100 |
| $\alpha^{13}$ | 001010 | 0110101011111110000001000011000101001111010001110010010110111011 |
| $\alpha^{14}$ | 010100 | 0011010101111111000000100001100010100111101000111001001011011101 |
| $\alpha^{15}$ | 101000 | 1001101010111111100000010000110001010011110100011100100101101110 |
| $\alpha^{16}$ | 010011 | 1100110101011111110000001000011000101001111010001110010010110111 |
| $\alpha^{17}$ | 100110 | 0110011010101111111000000100001100010100111101000111001001011011 |
| $\alpha^{18}$ | 001111 | 1011001101010111111100000010000110001010011110100011100100101101 |
| $\alpha^{19}$ | 011110 | 1101100110101011111110000001000011000101001111010001110010010110 |
| $\alpha^{20}$ | 111100 | 1110110011010101111111000000100001100010100111101000111001001001 |
| $\alpha^{21}$ | 111011 | 0111011001101010111111100000010000110001010011110100011100100101 |
| $\alpha^{22}$ | 110101 | 1011101100110101011111110000001000011000101001111010001110010010 |
| $\alpha^{23}$ | 101001 | 1101110110011010101111111000000100001100010100111101000111001001 |
| $\alpha^{24}$ | 010001 | 0110111011001101010111111100000010000110001010011110100011100100 |
| $\alpha^{25}$ | 100010 | 1011011101100110101011111110000001000011000101001111010001110010 |
| $\alpha^{26}$ | 000111 | 0101101110110011010101111111000000100001100010100111101000111001 |
| $\alpha^{27}$ | 001110 | 0010110111011001101010111111100000010000110001010011110100011100 |
| $\alpha^{28}$ | 011100 | 1001011011101100110101011111110000001000011000101001111010001110 |
| $\alpha^{29}$ | 111000 | 0100101101110110011010101111111000000100001100010100111101000111 |
| $\alpha^{30}$ | 110011 | 0010010110111011001101010111111100000010000110001010011110100011 |
| $\alpha^{31}$ | 100101 | 1001001011011101100110101011111110000001000011000101001111010001 |
| $\alpha^{32}$ | 001001 | 1100100101101110110011010101111111000000100001100010100111101000 |
| $\alpha^{33}$ | 010010 | 1110010010110111011001101010111111000000010000110001010011110100 |
| $\alpha^{34}$ | 100100 | 0111001001011011101100110101011111100000010000110001010011110100 |
| $\alpha^{35}$ | 001011 | 0011100100101101110110011010101111111000000100001100010100111101 |
| $\alpha^{36}$ | 010110 | 0001110010010110111011001101010111111100000010000110001010011110 |
| $\alpha^{37}$ | 101100 | 1000111001001011011101100110101011111110000001000011000101001111 |
| $\alpha^{38}$ | 011011 | 0100011100100101101110110011010101111111000000100001100010100111 |
| $\alpha^{39}$ | 110110 | 1010001110010010110111011001101010111111000000010000110001010011 |
| $\alpha^{40}$ | 101111 | 1101000111001001011011101100110101011111110000001000011000101001 |
| $\alpha^{41}$ | 011101 | 1110100011100100101101110110011010101111111000000100001100010100 |
| $\alpha^{42}$ | 111010 | 1111010001110010010110111011001101010111111100000010000110001010 |
| $\alpha^{43}$ | 110111 | 0111101000111001001011011101100110101011111110000001000011000101 |
| $\alpha^{44}$ | 101101 | 0011110100011100100101101110110011010101111111000000100001100010 |
| $\alpha^{45}$ | 011001 | 1001111010001110010010110111011001101010111111100000010000110001 |
| $\alpha^{46}$ | 110010 | 0100111101000111001001011011101100110101011111110000010000110001 |
| $\alpha^{47}$ | 100111 | 1010011110100011100100101101110110011010101111111000000100001100 |
| $\alpha^{48}$ | 001101 | 0101001111010001110010010110111011001101010111111100000010000110 |
| $\alpha^{49}$ | 011010 | 0010100111101000111001001011011101100110101011111110000001000011 |
| $\alpha^{50}$ | 110100 | 0001010011110100011100100101101110110011010101111111000000100001 |
| $\alpha^{51}$ | 101011 | 1000101001111010001110010010110111011001101010111111100000010000 |
| $\alpha^{52}$ | 010101 | 1100010100111101000111001001011011101100110101011111110000001000 |
| $\alpha^{53}$ | 101010 | 0110001010011110100011100100101101110110011010101111111000000100 |
| $\alpha^{54}$ | 010111 | 0011000101001111010001110010010110111011001101010111111100000010 |
| $\alpha^{55}$ | 101110 | 0001100010100111101000111001001011011101100110101011111110000010 |
| $\alpha^{56}$ | 011111 | 0000110001010011110100011100100101101110110011010101111111000001 |
| $\alpha^{57}$ | 111110 | 1000011000101001111010001110010010110111011001101010111111100000 |
| $\alpha^{58}$ | 111111 | 0100001100010100111101000111001001011011101100110101011111110000 |
| $\alpha^{59}$ | 111101 | 0010000110001010011110100011100100101101110110011010101111111000 |
| $\alpha^{60}$ | 111001 | 0001000011000101001111010001110010010110111011001101010111111100 |
| $\alpha^{61}$ | 110001 | 0000100001100010100111101000111001001011011101100110101011111110 |
| $\alpha^{62}$ | 100001 | 0000010000110001010011110100011100100101101110110011010101111111 |

We will now describe the demodulation of the signal modulated in this manner, after transmission of the signal in a noisy channel and more specifically in a non-frequency-selective Rayleigh channel with slow fading.

In the remainder of the description, the following notations are used:

X∈GF (64) is any code word symbol;

$Y=[y_0, y_1, \ldots, y_{63}]$ is the BPSK signal of any CCSK sequence;

$PN_k=[p_0^k, p_1^k, \ldots, p_{63}^k]$ is the sequence obtained by shifting the sequence $PN_0$ by k positions, with k∈[0,63]; ∀i∈[0,63], $PN_0[i]=PN_k[(i+k) \mod 64]$;

$X_k=[x_0^k, x_1^k, \ldots, x_5^k]$ is the 6-bit symbol which corresponds to the sequence $PN_k$; $X_k \in GF(64)$;

$Y_k=[y_0^k, y_1^k, \ldots, y_{63}^k]$ is the BPSK signal of the sequence $PN_k$; and $Z=[z_0, z_1, \ldots, z_{63}]$ is the noisy signal received, with $z_i \in \Re$, $\forall i \in [0,63]$.

The transmission channel considered here is a non-frequency-selective Rayleigh channel; the discrete representation of the received signal is in the form:

$$\forall i \in [0,63] z_i = h_i \cdot y_i + n_i$$

where $-n_i$, is an additive white Gaussian noise (AWGN) sample comprising identically distributed and independent samples having a zero mean and a spectral density of power $N_0/2$; and $h_i$ is described by the following Rayleigh probability density function:

$$P(h_i) = 2 \cdot h_i \cdot e^{-h_i^2} \text{ for } h_i > 0$$

$H=[h_0, h_1, \ldots, h_{63}]$ indicates the set of Rayleigh factors associated with a received symbol of 64 chips. If $h_i=1$ $\forall i \in [0, 63]$, the channel is an AWGN channel.

The status of the transmission channel is assumed to be known by the receiving device. The transmission of state information for the channel is considered ideal. In reception, each signal $z_i$ is equalized by the associated factor $h_i$.

To decode the received signal, the decoder must receive as input the log-likelihood ratio values or LLR values. The mathematical expression of these LLR values is as follows:

$$LLR(X_k) = \ln\left(\frac{P(Z_{/(H, X=X_k)})}{P(Z_{/(H, X=X_0)})}\right) \quad (1)$$

$$= \ln\left(\frac{P(Z_{/(H, Y=Y_k)})}{P(Z_{/(H, Y=Y_0)})}\right)$$

$$= \ln\left(\frac{\prod_{i=0}^{63} P(Z_{i/(h_i, y_i=y_i^k)})}{\prod_{i=0}^{63} P(Z_{i/(h_i, y_i=y_i^0)})}\right)$$

However, $$P(Z_{i/(h_i, y_i=y_i^k)}) = \frac{1}{\sqrt{2 \cdot \pi \cdot \sigma^2}} \cdot \exp\left(-\frac{(z_i - h_i \cdot y_i^k)^2}{2 \cdot \sigma^2}\right)$$

We thus obtain:

$$LLR(X_k) = \frac{1}{\sigma^2} \cdot \sum_{i=0}^{63} (h_i \cdot y_i^k \cdot z_i) - \frac{1}{\sigma^2} \cdot \sum_{i=0}^{63} (h_i \cdot y_i^0 \cdot z_i)$$

As the variance $\sigma$ of the channel is a constant term, this term can be eliminated to simplify the calculations. We then obtain the simplified expression $$LLR(X_k) = \sum_{i=0}^{63} (h_i \cdot y_i^k \cdot z_i) - \sum_{i=0}^{63} (h_i \cdot y_i^0 \cdot z_i)$$

Figure 3:
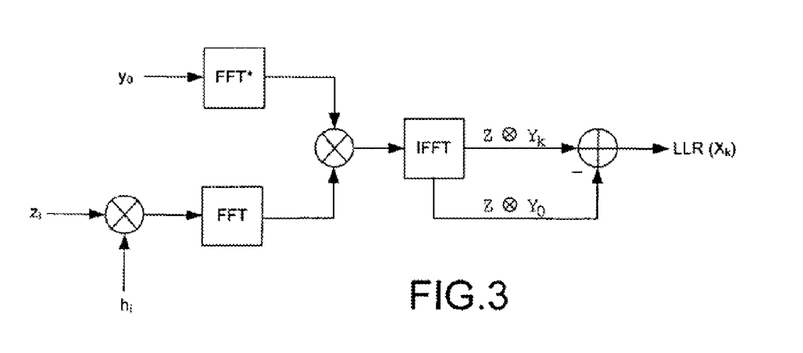
FIG. 3, a function diagram illustrating the calculation of the log-likelihood ratio values in reception.

Each of the two sums in the above expression is the correlation between the received signal weighted by the Rayleigh coefficients and one of the possible CCSK sequences. As a result, it is possible to calculate the LLRs using FFT and IFFT operations as represented in FIG. 3.

The complex conjugate of the FFT of the sequence $Y_0$ and the FFT of the received signal Z weighted by the Rayleigh coefficients H are calculated. The IFFT of the product of these two results is then calculated to obtain the required correlation values, which is $Z \otimes Y_k$. Finally the correlation value of $Z \otimes Y_0$ is subtracted from the correlation values $Z \otimes Y_k$ to obtain the value $LLR(X_k)$. In this example, we obtain $LLR(X_0)=0$. Alternatively, it is possible to replace the term $P(Z_{/(H, X=X_0)})$ in expression (1) of $LLR(X_k)$ with the term having the lowest value. In this case, the values of the LLRs are all positive.

Figure 4:
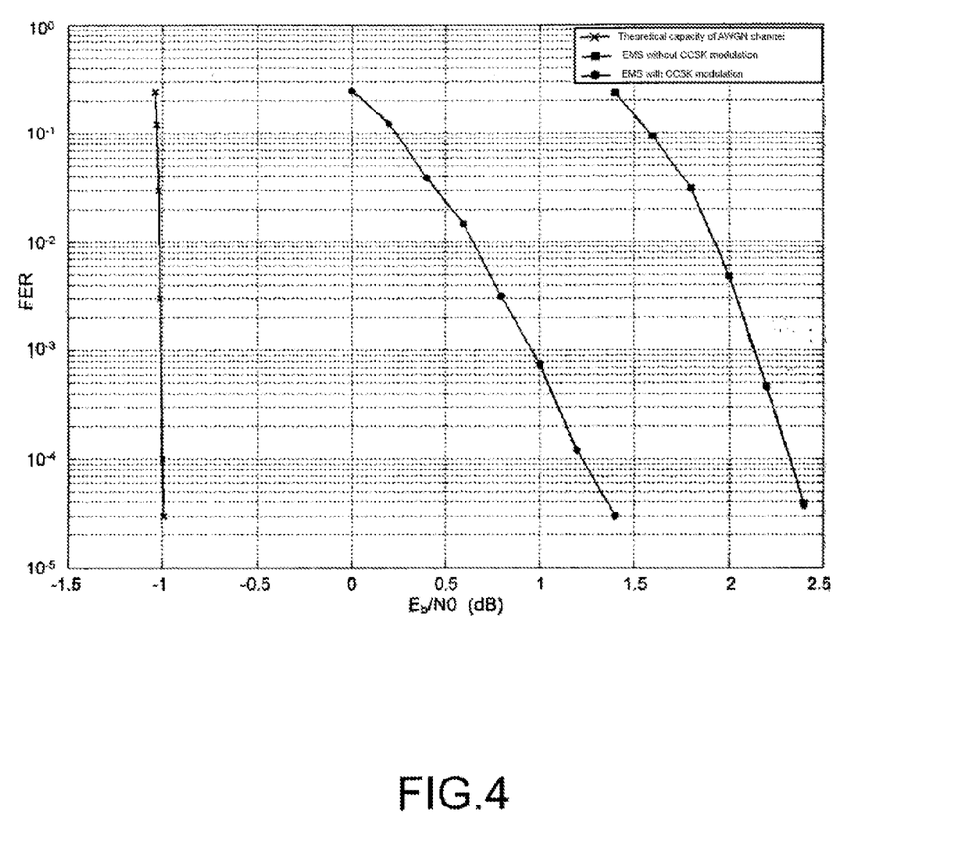
FIG. 4, a graph of curves illustrating the frame error rate in reception, with and without CCSK modulation in transmission, for a Gaussian channel.

The performances with this processing are illustrated by the curves in FIG. 4. The frame error rate FER is evaluated for a channel affected by additive white Gaussian noise (AWGN), with and without CCSK modulation.

The decoding algorithm employed to obtain these curves is an EMS (Extended Min-Sum) algorithm, which is well known to a person skilled in the art and which is described in detail in the document entitled "Algorithmes simplifies pour le décodage de codes LDPC non binaires" (Simplified algorithms for decoding non-binary LDPC codes) by A. Voicila, D. Declercq, M. Fossorier and F. Verdier, GRETSI, Louvain-la-Neuve, Belgium, September 2005. This algorithm is a sub-optimal algorithm intended to reduce decoding complexity. For each decoding iteration, the variable nodes and the parity nodes only exchange the $n_m$ most reliable LLR values.

FIG. 4 shows some simulation results in graphical form:
   a first curve illustrates the decoding performance without CCSK modulation;
   a second curve illustrates the decoding performance with CCSK modulation; and
   a third curve illustrates the performance of a theoretical AWGN channel.

The simulations were performed with the following coding and decoding parameters:
   the NB-LDPC codes are within the Galois field GF(64);
   the length of the NB-LDPC codes is equal to 192 symbols or 192×6 bits;
   the code rate (the ratio of useful information bits to all bits transmitted) is 0.5;
   the degree of rows and the degree of columns of the parity check matrix used for coding and decoding are respectively 4 and 2;
   the EMS algorithm only takes into account the 24 most reliable LLR values;
   the maximum number of iterations for the decoding is limited to 8; and
   the pseudo-random sequence used for the CCSK modulation is the sequence $PN_0$ defined above.

The third curve illustrating the performance of a theoretical AWGN channel corresponds to the transmission of a code 196×64 bits in length and a code rate of 3/64. These two values respectively correspond to the effective code length and effective code rate of NB-LDPC coding with CCSK modulation.

These curves give the frame error rate FER as a function of the ratio $E_b/N_0$ expressed in decibels, where $E_b$ is the energy transmitted per bit and $N_0$ is the noise spectral density.

From these curves, we observe that the CCSK modulation improves the decoding performance. This improvement is explained by the diversity introduced by the CCSK modulation. CCSK modulation increases the effective code length, advancing from 192×6 bits without CCSK modulation to 192×64 chips with CCSK modulation.

Moreover, as indicated above, the LLR values are calculated in the frequency domain via FFT and IFFT operations. This property of the CCSK modulation is highly attractive in the field of wireless communication systems using a single carrier with frequency domain equalization or SC-FDE. The FFT values calculated for the received signal can then be used both for the calculation of the LLR values and for the frequency equalization. In the field of wireless communication systems, this gives SC-FDE single carrier systems an advantage over multi-carrier OFDM (Orthogonal Frequency Division Multiplexing) systems in which the equalization is performed on a temporal representation of the received signal.

Figure 5:
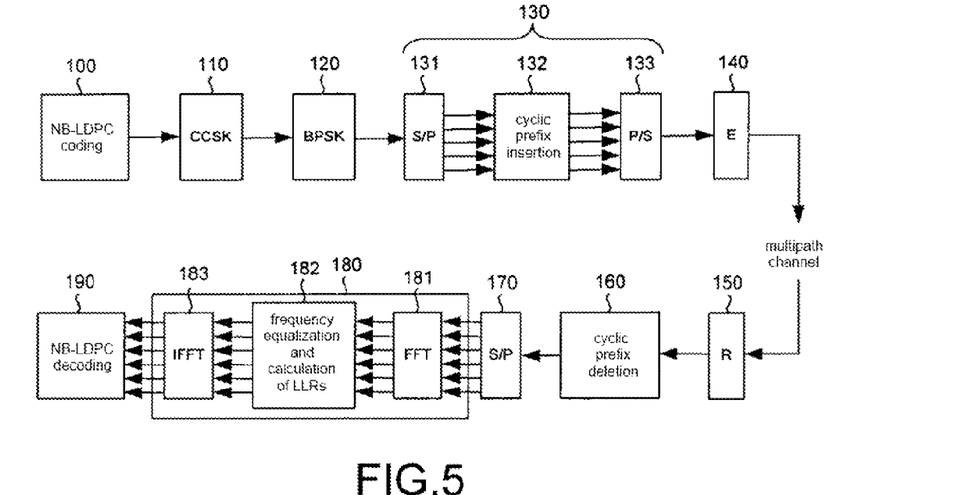
FIG. 5, a block diagram illustrating the transmission and reception of NB-LDPC codes via a multipath channel, in the case of single carrier modulation preceded by CCSK modulation.
Figure 6:
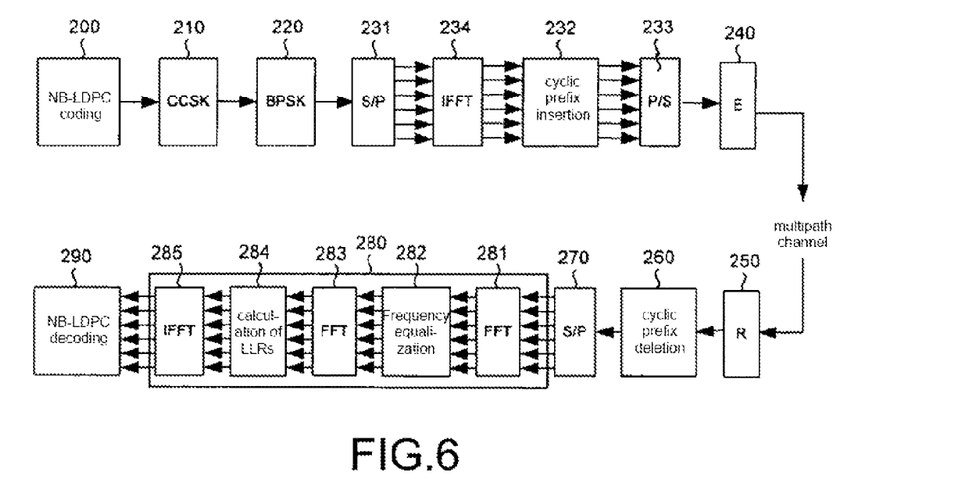
FIG. 6, a block diagram illustrating the transmission and reception of NB-LDPC codes via a multipath channel, in the case of OFDM modulation preceded by CCSK modulation.

This benefit is illustrated by FIGS. 5 and 6 which respectively represent the block diagrams of an SC-FDE system and of an OFDM system, these two systems comprising a CCSK modulation step and an equalization step.

In both systems, an NB-LDPC encoder performs a coding step (step 100 for the SC-FDE system; step 200 for the OFDM system). This coding step consists in particular of adding redundancy to the input data so as to generate code words each comprising a predetermined number of symbols of the Galois field GF(q). Each code word symbol is then converted (step 110; step 210) into a CCSK sequence having a length greater than or equal to q chips. The CCSK sequences are then used to modulate a carrier signal in a BPSK modulation step (step 120; step 220).

In the SC-FDE system (FIG. 5), a cyclic prefix CP is inserted (step 130) after the carrier signal modulation step. This step includes a step 131 of serial-parallel conversion, a step 132 of inserting the actual cyclic prefix, and a step 133 of the reverse conversion. The cyclic prefix CP is thus added directly to each BPSK-modulated symbol, referred to as symbol SC.

In the OFDM system (FIG. 6), after the serial-parallel conversion (step 231), a q-point Inverse Fast Fourier Transform (step 234) is applied to the BPSK-modulated CCSK sequence in order to obtain OFDM symbols of q elements to which a cyclic prefix is added (step 232). A parallel-serial conversion (step 233) is then carried out after the insertion.

In both systems, the cyclic prefix is a symbol extension obtained by copying the last elements of each OFDM or SC symbol and placing them in front of the symbol. The length of the cyclic prefix is preferably greater than the maximum delay of the multipath channel. The effect of inter-symbol interference from one symbol on the next symbol is then confined within the cyclic prefix of the next symbol so that this will not affect the FFT of the next symbol. The SC and OFDM symbols are then transmitted (step 140; step 240) via a multipath channel to a remote receiver. Once the cyclic prefix is deleted in reception, the received signal is circularly convolved with the channel impulse response so that the frequency equalization is done by dividing the fast Fourier transform of the received signal by the channel transfer function.

The receiver receives (step 150 for the SC-FDE system; step 250 for the OFDM system) the transmitted symbols and performs a step of deleting the cyclic prefix (step 160; step 260), a step of serial-parallel conversion (step 170; step 270) before a global step of equalization and calculation of LLR values (step 180; step 280). The calculated LLR values are then decoded by an NB-LDPC decoder (step 190; step 290).

Steps 180 and 280, performing the equalization and the calculation of LLR values, are different. In the SC-FDE system, step 180 contains a single FFT step 181, serving for both the equalization and the calculation of LLR values (step 182). An IFFT operation (step 183) is then applied to obtain the LLR values. In the OFDM system, step 280 comprises two FFT steps, a first FFT step 281 preceding the equalization step 282 and a second FFT step 283 preceding the step of calculating the LLR values 284. An IFFT step 285 is finally applied to obtain the LLR values.

The equalization and the calculation of LLR values are described below for both systems. For these steps, the following notations are used:

x denotes the BPSK-modulated CCSK sequence;
$x_{OFDM}$=IFFT(x) is the OFDM symbol associated with x;
$x_{SC}$=x is the SC symbol;
$y_{OFDM}$ is the OFDM symbol received after deleting the cyclic prefix;
$y_{SC}$ is the SC symbol received after deleting the cyclic prefix;
h is the channel impulse response; and
n is a vector of q complex Gaussian noise operations.

The equalization performed is MMSE (Minimum Mean Square Error).

Figure 7:
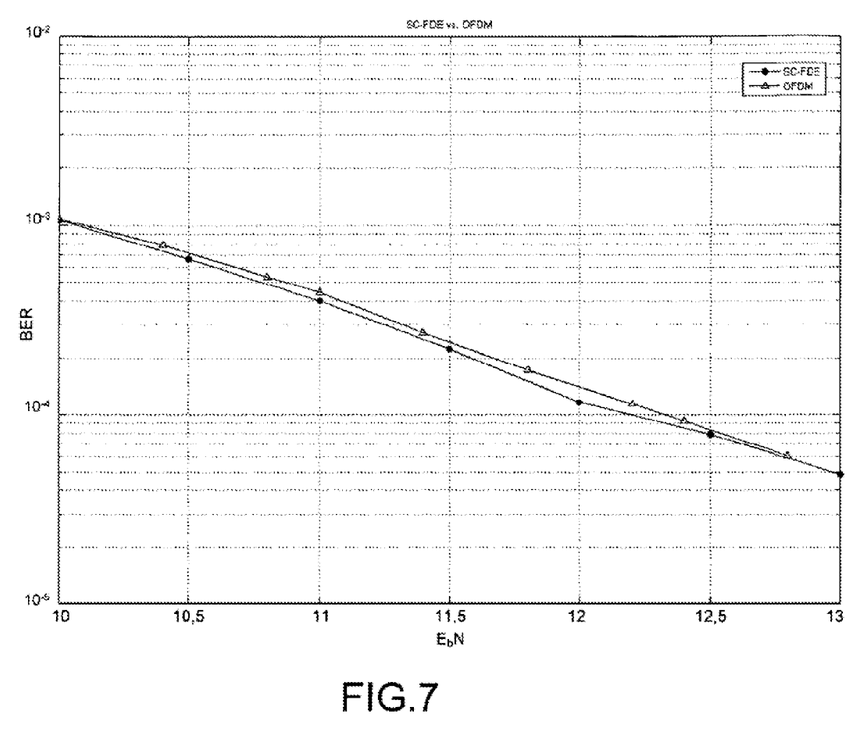
FIG. 7, a graph of curves illustrating the bit error rate in reception in the case of single carrier modulation and in the case of OFDM modulation.

In the case of the OFDM system (FIG. 7), the signal $y_{OFDM}$ obtained after deleting the cyclic prefix from the received signal can be written as follows:

$$y_{OFDM}(i) = \sum_{j=0}^{D-1} h(j) \cdot x_{OFDM}(i - j \bmod q) + n(i)$$

$$\forall i \in [0, q-1]$$

where D is the maximum channel delay.

If we define the q-point FFT of $y_{OFDM}$ by the relation $Y_{OFDM}(m)=FFT_m(y_{OFDM})$ where m is the $m^{th}$ point of the FFT, and the FFT of h by the relation $H(m)=FFT_m(h)$, then the $m^{th}$ coefficient of the MMSE equalization is defined by the relation:

$$\beta_m = \frac{H(m)^*}{\|H(m)\| + q \cdot \sigma^2} \quad \forall m \in [0, q-1]$$

where σ is the deviation of the Gaussian noise.

After equalization, the sample Y(m) becomes the sample Z(m) defined by the following relation:

$$Z(m) = \beta_m \cdot Y_{OFDM}(m) \forall m \in [0, q-1]$$

The calculation of the correlations is then performed in the frequency domain. The equalized samples are thus transposed into the frequency domain by step 283 and the correlations are then calculated by multiplying the FFT of Z by the conjugate FFT of the BPSK-modulated sequence $PN_0$. The vector of the correlation values is obtained by means of the IFFT. Lastly, normalization yields the vector of the LLR values.

In the case of the SC-FDE system (FIG. 6), the signal $y_{SC}$ obtained by deleting the cyclic prefix from the received signal can be defined as follows:

$$y_{SC}(i) = \sum_{j=0}^{D-1} h(j) \cdot x_{SC}(i - j \bmod q) + n(i)$$

$$\forall i \in [0, q-1]$$

The $m^{th}$ coefficient of the MMSE equalization is defined by the relation:

$$\beta_m = \frac{H(m)^*}{\|H(m)\| + \sigma^2} \quad \forall m \in [0, q-1]$$

In this case, computation of the LLR values can be performed at the same time as the equalization. If we denote the $m^{th}$ coefficient of the fast Fourier transform of the BPSK-modulated sequence $PN_0$ as $\gamma_m = FFT(PN_0)(m)$, the equalization and the computation of the LLR values are performed by:

$$Z(m) = \gamma_m \cdot \beta_m \cdot Y_{SC}(m) \, \forall m \in [0, q-1]$$

The vector of correlation values is then obtained by applying an IFFT to Z (step 285). The vector of LLR values is obtained by normalizing the vector of correlation values.

Thus, in the case of a single carrier system, the step of frequency equalization and the step of calculating the correlation values can be merged into a single step. Only one FFT step is necessary in reception. The use of CCSK modulation is therefore particularly advantageous in single-carrier systems.

FIG. 7 illustrates the decoding performance of both the OFDM and SC-FDE systems. This Figure graphs the simulation results as curves. A first curve represents the results of the OFDM system and a second curve represents the results of the SC-FDE system. The LDPC code used is defined over GF(64), the length being 1008 bits and the rate being 1/2. The EMS algorithm has the same parameters as those used for the simulations in FIG. 4. One will note that the performance in terms of bit error rate BER are almost identical in both systems.

It follows that, given their low implementation cost (only 1 pseudo-random generator in transmission; only one FFT operation in reception), single-carrier systems using NB-LDPC codes and CCSK modulation can be regarded as a very attractive solution for the wireless communication systems of the future. These systems have also a crest factor, commonly referred to as PAPR (Peak to Average Power Ratio), that is lower than in OFDM systems. This reduces the signal transmission power and allows the use of smaller, less expensive amplifiers operating linearly over the range of variation of the signal, in comparison to OFDM systems. It also reduces the power consumption of the system.

Although the invention has been described in relation to various specific embodiments, it is obvious that it is in no way limited thereby and that it includes all technical equivalents of the means described as well as any combinations if these lie within the scope of the invention.

The invention claimed is:

1. A method for transmitting symbols of non-binary error-correcting code words via a single carrier system, each code word symbol comprising p bits, wherein p is an integer greater than 0, said method comprising:
   a first modulation step associating each p-bit code word symbol with a sequence of at least $2^p$ chips selected from a set of $2^p$ sequences,
   a second modulation step to modulate a phase or amplitude of a single carrier signal with sequences associated with the non-binary error-correcting code words and generate modulated symbols having a size equal to a size of the sequences associated with the non-binary error-correcting code words, and
   a transmission step for transmitting the modulated single carrier signal via said transmission channel,
   wherein the first modulation step is a spread spectrum modulation of a cyclic code-shift keying type using a basic pseudo-random sequence of at least $2^p$ chips, the $2^p$ sequences being obtained by a circular shift of the basic pseudo-random sequence, and wherein the method further comprises, after said second modulation step, a step of inserting a cyclic prefix into each modulated sequence.

2. A method for receiving a non-binary error-correcting code signal intended to be transmitted according to the transmission method of claim 1 and transmitted on a single carrier signal, comprising:
   a step of receiving the non-binary error-correcting code signal,
   a step of deleting the cyclic prefix from each symbol;
   a step of fast Fourier transform of the received signal in order to generate samples in frequency domain, and
   a step of jointly performing frequency equalization and calculation of log-likelihood ratio values for said samples.

3. A transmitter capable of transmitting symbols of non-binary error-correcting code words via a single carrier system, each code word symbol comprising p bits, wherein p is an integer greater than 0, said transmitter comprising:
   a first modulator associating each p-bit code word symbol with a sequence of at least $2^p$ chips selected from a set of $2^p$ sequences,
   a second modulator to modulate a phase or amplitude of a single carrier signal with sequences associated with the non-binary error-correcting code words and generate modulated symbols having a size equal to a size of the sequences associated with the non-binary error-correcting code words, and
   a transmitter circuit capable of transmitting the modulated single carrier signal via said transmission channel,
   wherein the first modulator is a spread spectrum modulator of a cyclic code-shift keying type using a basic pseudo-random sequence of at least $2^p$ chips, the $2^p$ possible sequences being obtained by a circular shift of the basic pseudo-random sequence, and
   wherein the transmitter further comprises a circuit capable of inserting a cyclic prefix into each modulated sequence.

4. A receiver comprising:
   a receiver circuit capable of receiving a transmitted non-binary error-correcting code words transmitted on a single carrier signal, wherein each non-binary error-correcting code word symbol comprising p bits, wherein p is an integer greater than 0, the modulated single carrier signal carrying modulated sequences each comprising a cyclic prefix and modulated symbols having a size equal to a size of sequences of at least $2^p$ chips selected from a set of $2^p$ sequences, the modulated symbols being generated by a phase or amplitude modulation of at least one carrier signal with the sequences of at least $2^p$ chips, each p-bit non-binary code word symbol being associated with a sequence of the set of $2^p$ sequences by a spread spectrum modulation of a cyclic code-shift type using a basic pseudo-random sequence of at least $2^p$ chips, the $2^p$ sequences being obtained by a circular shift of the basic pseudo-random sequence,
   a circuit capable of deleting the cyclic prefix from each modulated sequence,
   a circuit capable of fast Fourier transform of the received signal in order to generate samples in a frequency domain, and
   a circuit capable of jointly performing frequency equalization and calculation of log-likelihood ratio values for said samples.

* * * * *